(12) United States Patent
Weis et al.

(10) Patent No.: US 10,973,113 B2
(45) Date of Patent: Apr. 6, 2021

(54) COMPONENT CARRIER WITH TRANSISTOR COMPONENTS ARRANGED SIDE BY SIDE

(71) Applicant: AT&S Austria Technologie & Systemtechnik Aktiengesellschaft, Leoben (AT)

(72) Inventors: Gerald Weis, St. Marein im Mürztal (AT); Christian Vockenberger, Leoben (AT)

(73) Assignee: AT&S Austria Technologie & Systemtechnik Aktiengesellschaft, Leoben (AT)

(*) Notice: Subject to any disclaimer, the term of this patent is extended or adjusted under 35 U.S.C. 154(b) by 0 days.

(21) Appl. No.: 16/175,596

(22) Filed: Oct. 30, 2018

(65) Prior Publication Data

US 2019/0132983 A1     May 2, 2019

(30) Foreign Application Priority Data

Nov. 2, 2017    (EP) .................................... 17199727

(51) Int. Cl.
    *H05K 7/14*       (2006.01)
    *H05K 7/20*       (2006.01)
                (Continued)

(52) U.S. Cl.
    CPC ....... *H05K 1/0206* (2013.01); *H01L 23/3121* (2013.01); *H01L 23/34* (2013.01);
                (Continued)

(58) Field of Classification Search
    CPC ...... H05K 7/1432; H05K 7/205; H05K 7/209; H05K 1/0201–0212; H05K 1/0298;
                 (Continued)

(56) References Cited

U.S. PATENT DOCUMENTS 6,212,087 B1     4/2001   Grant et al.
7,129,577 B2 *   10/2006   Maxwell ............. H01L 23/5385
                                          257/707

(Continued)

FOREIGN PATENT DOCUMENTS

CN          101847791 A     9/2010
CN          202259256 U     5/2012
             (Continued)

OTHER PUBLICATIONS

Office Action (Translation) in Application No. 2018113035030; pp. 1-3; dated Dec. 29, 2020; China National Intellectual Property Administration; No. 6, Xitucheng Lu, Jimenqiao Haidian District, Beijing City, China.

(Continued)

*Primary Examiner* — Zachary Pape
*Assistant Examiner* — Amir A Jalali
(74) *Attorney, Agent, or Firm* — Robert A. Blaha; Smith Tempel Blaha LLC

(57) ABSTRACT

A component carrier with a stack including a plurality of electrically conductive layer structures and/or electrically insulating layer structures, and a first transistor component and a second transistor component embedded side-by-side in the stack.

17 Claims, 9 Drawing Sheets

(51) Int. Cl.
*H05K 1/02* (2006.01)
*H05K 1/18* (2006.01)
*H05K 1/11* (2006.01)
*H01L 23/31* (2006.01)
*H01L 23/34* (2006.01)
*H01L 23/538* (2006.01)
*H02M 7/00* (2006.01)
*H05K 1/03* (2006.01)
*H01L 23/36* (2006.01)
*H01L 23/367* (2006.01)

(52) U.S. Cl.
CPC .......... *H01L 23/36* (2013.01); *H01L 23/5389* (2013.01); *H02M 7/003* (2013.01); *H05K 1/0203* (2013.01); *H05K 1/0207* (2013.01); *H05K 1/0298* (2013.01); *H05K 1/0306* (2013.01); *H05K 1/115* (2013.01); *H05K 1/185* (2013.01); *H05K 1/186* (2013.01); *H05K 7/1432* (2013.01); *H05K 7/209* (2013.01); *H01L 23/3677* (2013.01); *H01L 2224/04105* (2013.01); *H01L 2224/2518* (2013.01); *H05K 1/0209* (2013.01); *H05K 1/181* (2013.01); *H05K 2201/062* (2013.01); *H05K 2201/066* (2013.01); *H05K 2201/10015* (2013.01); *H05K 2201/10151* (2013.01); *H05K 2201/10166* (2013.01); *H05K 2201/10325* (2013.01)

(58) Field of Classification Search
CPC ...... H05K 1/0306; H05K 1/115; H05K 1/186; H05K 2201/06; H05K 2201/10416; H01L 23/24; H01L 23/3128; H01L 23/5383; H01L 25/18; H01L 25/20; H01L 23/34–4735; H02M 7/003
USPC .......... 361/707, 719–722; 174/252; 257/700, 257/713, 720
See application file for complete search history.

(56) References Cited

U.S. PATENT DOCUMENTS

| | | | | |
|---|---|---|---|---|
| 8,134,841 B2* | 3/2012 | Suzuki | ............ | H01L 23/49833 |
| | | | | 361/761 |
| 8,929,081 B2* | 1/2015 | Elkaslassy | ............ | H05K 1/181 |
| | | | | 361/720 |
| 9,773,766 B2* | 9/2017 | Ye | ............ | H01L 25/00 |
| 9,781,845 B2* | 10/2017 | Stahr | ............ | H05K 3/323 |
| 10,137,789 B2* | 11/2018 | Xu | ............ | H02M 7/003 |
| 10,147,664 B2* | 12/2018 | Refai-Ahmed | ............ | H01L 23/433 |
| 10,250,115 B2* | 4/2019 | Xu | ............ | H02M 7/003 |
| 10,389,235 B2* | 8/2019 | Giuliano | ............ | H02M 3/1582 |
| 2006/0238927 A1 | 10/2006 | Morbe et al. | | |
| 2006/0238937 A1 | 10/2006 | Esmark et al. | | |
| 2006/0290689 A1 | 12/2006 | Grant et al. | | |
| 2009/0001535 A1 | 1/2009 | Heng et al. | | |
| 2012/0256194 A1* | 10/2012 | Yoshihara | ............ | H01L 24/40 |
| | | | | 257/77 |
| 2013/0010446 A1 | 1/2013 | Henrik et al. | | |
| 2014/0068924 A1* | 3/2014 | Yu | ............ | H05K 13/04 |
| | | | | 29/592.1 |
| 2014/0077354 A1* | 3/2014 | Yamamoto | ............ | H02M 7/003 |
| | | | | 257/712 |
| 2014/0218869 A1* | 8/2014 | Yamanaka | ............ | H05K 3/0058 |
| | | | | 361/707 |
| 2015/0054159 A1 | 2/2015 | Hoegerl et al. | | |
| 2016/0120069 A1* | 4/2016 | Raassina | ............ | H05K 7/20509 |
| | | | | 361/697 |
| 2016/0181894 A1 | 6/2016 | Lee et al. | | |
| 2017/0092630 A1* | 3/2017 | Weis | ............ | H01L 23/3677 |
| 2017/0164509 A1* | 6/2017 | Flamm | ............ | H02M 7/003 |
| 2017/0171978 A1 | 6/2017 | Yang et al. | | |
| 2017/0186661 A1* | 6/2017 | Aoki | ............ | H01L 23/345 |
| 2017/0236931 A1* | 8/2017 | Meiser | ............ | H01L 29/1095 |
| | | | | 257/334 |
| 2018/0054119 A1* | 2/2018 | Cho | ............ | H05K 3/303 |
| 2018/0211899 A1* | 7/2018 | Morianz | ............ | H01L 23/5383 |
| 2018/0375506 A1* | 12/2018 | Tanemura | ............ | G01R 31/2628 |

FOREIGN PATENT DOCUMENTS

| | | |
|---|---|---|
| CN | 202957761 U | 5/2013 |
| CN | 103974601 A | 8/2014 |
| CN | 104392683 A | 3/2015 |
| DE | 102011115376 A1 | 4/2013 |
| DE | 102014218240 A1 | 9/2015 |
| EP | 0710983 B1 | 5/2006 |
| EP | 3148300 A1 | 3/2017 |
| WO | WO2007071216 A1 | 6/2007 |

OTHER PUBLICATIONS

Office Action in Application No. 2018113035030; pp. 1-11; dated Dec. 29, 2020; China National Intellectual Property Administration; No. 6, Xitucheng Lu, Jimenqiao Haidian District, Beijing City, China.

* cited by examiner

COMPONENT CARRIER WITH TRANSISTOR COMPONENTS ARRANGED SIDE BY SIDE

TECHNICAL FIELD

The present invention relates to a method of manufacturing a component carrier, a component carrier, and an electronic device.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

In particular, efficient integration of a transistor function in a component carrier is a challenge.

EP 3,148,300 A1 discloses that in a connection system for electronic components comprising a plurality of insulating layers and conductive layers and further comprising at least one embedded electronic component embedded within at least one of the plurality of insulating layers and conductive layers, the at least one embedded electronic component is at least one first transistor having a bulk terminal thereof in thermal contact with a thermal duct comprised of a plurality of vias reaching through at least one of an insulating layer and a conductive layer of the connection system for electronic components and emerging on a first outer surface of the connection system for electronic components under a first surface-mounted component.

SUMMARY

There may be a need to integrate a transistor function in a component carrier in a way to enable a high thermal performance and a compact design.

A method of manufacturing a component carrier, a component carrier, and an electronic device according to the independent claims are provided.

According to an exemplary embodiment of the invention, a component carrier is provided which comprises a stack including a plurality of electrically conductive layer structures and/or electrically insulating layer structures, and a first transistor component and a second transistor component embedded side-by-side in the stack.

According to another exemplary embodiment of the invention, an electronic device is provided which includes a mounting body (for example a printed circuit board, PCB), and a component carrier having the above-mentioned features mounted on and/or embedded in the mounting body.

According to still another exemplary embodiment of the invention, a method of manufacturing a component carrier is provided, where the method includes forming a connected stack having a plurality of electrically insulating layer structures and/or electrically conductive layer structures, and embedding a first transistor component and a second transistor component side-by-side in the stack.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above mentioned types of component carriers.

In the context of the present application, the term "transistor component" may particularly denote an electronic member which fulfills a transistor function, in particular the function of exactly one transistor. Such a transistor may be a field effect transistor (in particular a MOSFET, metal oxide semiconductor field effect transistor) or a bipolar transistor (in particular an IGBT, insulated gate bipolar transistor). Preferably, the transistor component is embodied as a semiconductor chip with an integrated transistor. In other words, the transistor component may be a transistor chip. For instance, the respective transistor component may be manufactured in semiconductor technology, in particular in silicon technology or in silicon carbide technology or in gallium nitride technology. In an embodiment, the transistor components may be two transistors connected in parallel. Particularly, the two transistor components may be two transistors connected in parallel for constituting a high-side and a low-side, which may, however, be then connected in series. The two transistor components may be embodied as two separate chips, i.e. one chip per transistor. The two transistor components may be of identical type, or may be of different type.

In the context of the present application, the term "transistor components embedded side-by-side" may particularly denote that the transistor components are arranged at least partially in juxtaposition. Their vertical extension ranges can coincide, can at least partially overlap, or a vertical extension range of one transistor component may be completely within a vertical extension range of the other transistor component. For instance, the transistor components may be only laterally spaced from one another rather than being arranged on top of one another, i.e. one above the other. In particular, the transistor components may be located so that their side walls face each other, in particular with a lateral gap in between (which gap may be filled with material of the stack). Upper main surfaces of the transistor components may be at least substantially at the same vertical level, for instance may be aligned. Lower main surfaces of the transistor components may be at least substantially at the same vertical level, for instance may be aligned. The transistor components may in particular be embedded within the same layer structure or between the same layer structures of the stack. The transistor components may be located at the same vertical level, for instance may have coinciding centers of gravity in a vertical direction normal to a gravitational force vector.

According to an exemplary embodiment of the invention, a component carrier with two transistor components is provided which are embedded in a stack of component carrier material side-by-side rather than one above the other.

This has a number of advantages: Firstly, embedding the transistor chips substantially on the same vertical level results in a flat and hence compact component carrier which has only a small space consumption in a vertical direction, for instance when mounted on a mounting body. Secondly, such a thin component carrier with heat generating surfaces of the transistor components very close to the surface of the component carrier results in an efficient heat removal and heat spreading when ohmic heat is generated by the transistor components during operation of the component carrier. This prevents overheating and improves the thermal performance of the component carrier as a whole. Moreover, proper heat dissipation suppresses thermal load and as a result reduces mechanical tensions within the component carrier (for instance due to different coefficients of thermal expansion of different materials of the layer stack). As a consequence, undesired effects of component carriers such as warpage and delamination can be efficiently prevented. Thirdly, embedding the transistor components juxtaposed and hence substantially on the same or at least on very similar vertical levels renders the manufacturing process very simple, since both transistor components can be embedded in a single common manufacturing procedure. An exemplary embodiment of the invention makes it in particular possible to provide a half bridge module in PCB (printed circuit board) technology with flat geometry and high thermal performance.

In the following, further exemplary embodiments of the method, the component carrier and the electronic device will be explained.

In an embodiment, the first transistor component and the second transistor component are connected to form a half-bridge circuit. A half-bridge circuit may comprise a so-called high-side transistor and a so-called low-side transistor which may be circuited or arranged in a cascode architecture. The two transistor components may be alternatingly switched on and off via corresponding control signals at inlet or input terminals. Two transistor terminals may be connected to one another at an outlet terminal of the half bridge. One or more of such half bridges may be used for fulfilling a certain electric function (for instance, a full bridge may be composed of two half bridges).

In an embodiment, the component carrier comprises at least one control chip (in particular embodied as at least one semiconductor chip) configured for controlling at least one of the first transistor component and the second transistor component. In particular, two control chips may be foreseen, one for each transistor component. The at least one control chip may apply the above-described control signals at inlet terminals of the transistor components.

In an embodiment, at least one of the at least one control chip is embedded in the stack, in particular side-by-side (more particularly at the same vertical level) with the first transistor component and the second transistor component. Hence, a control chip may also be configured as an embedded component. Embedding the one or more control chips at the same vertical level as the transistor components additionally contributes to the flat and vertically compact configuration of the component carrier and the efficient heat removal capability.

In another embodiment, at least one of the at least one control chip is surface mounted on the stack, preferably on a bottom side thereof. In other words, the at least one control chip may also be assembled in SMD (Surface Mounted Device) technology.

In an embodiment, the component carrier comprises at least one via, in particular a plurality of vias, extending vertically through at least part of the stack and electrically contacting at least one pad of at least one of the first transistor component and the second transistor component. For instance, a transistor component configured as a field effect transistor comprises a source terminal, a drain terminal and a gate terminal. Corresponding pads may be arranged for each of the mentioned terminals at one of two opposing main surfaces (i.e. an upper main surface and a lower main surface) of the respective transistor component. In order to connect the pads with other constituents of the component carrier and/or with an electronic environment of the component carrier, vertical interconnects such as vias may be formed in the stack and may extend up to the respective pads. Such vias may be formed by drilling holes in the stack (in particular by laser drilling or mechanical drilling) and by partially or completely filling these holes (in particular by plating) with electrically conductive material (in particular by copper). Via formation for the purpose of connecting pads of transistor components is not only advantageous in terms of providing reliable electrical connections, but can be used additionally or alternatively also for promoting heat removal (in particular due to the proper heat removal capability of copper).

Preferably, sets of coplanar vias may be connected to a main surface, further preferably to both opposing main surfaces, of the first transistor component and/or the second transistor component. This provides a proper electrical and thermal coupling of the respective transistor component.

In an embodiment, the component carrier comprises at least one electrically conductive sheet, plate or other bulky structure directly electrically contacting at least part of a main surface of, in particular a complete main surface of, at least one of the first transistor component and the second transistor component. The provision of a bulky electrically conductive sheet or plate (for instance a copper plate) embedded in the stack and electrically connected to pads of one or both of the transistor components provides at the same time a very low ohmic electric connection (resulting in low loss) and also a pronounced heat dissipation. In other words, the electrically conductive sheet may establish a full-area (in particular electrical and/or thermal) contact with the respective transistor component.

In an embodiment, the component carrier comprises at least one temperature sensor component embedded in the stack for sensing information indicative of temperature in the stack. Such a temperature sensor component (which may be embodied as a temperature sensitive resistor, or a semiconductor chip with heat sensing capability) may locally determine the temperature in an interior of the stack to thereby provide an indication of a possible overheating during operation of the component carrier. In particular, the temperature sensor component embedded in the stack can be arranged very close to one or more main heat sources of the component carrier, i.e. the transistor components or more particularly a most heat emitting surface thereof, so as to be capable of sensing locally most relevant temperature information. The temperature sensor component may be in direct contact with a respective one of the transistor components. The temperature sensor component may be embodied as a passive electric member.

In an embodiment, the component carrier is configured for reducing power or for switching off at least one of the first transistor component and the second transistor component when information sensed by the at least one temperature sensor component indicates overheating of the stack. For this purpose, the temperature sensor component may transmit a signal indicative of the present temperature within the stack to the at least one control chip. The latter may then adjust its control of the transistor component(s) accordingly so as to bring back or adjust a critical or undesired detected temperature into an acceptable or desired range.

In an embodiment, the component carrier comprises at least one socket on a main surface of the stack configured for plugging in a plug (such as a pin header) of another electronic member to be connected to the component carrier by a plug connection. By arranging the socket directly on the module-type component carrier, it is sufficient for a user to handle a single electronic member in form of the component carrier and simply plug or arrange a plug in the socket for establishing an electric connection. This achieves a very user convenient component carrier. Such a socket may for instance be a socket for a control connector or for a power connector.

In an embodiment, the component carrier comprises at least one DC (direct current) link capacitor. Such a DC link capacitor may be connected for instance for DC filtering and/or energy buffering. A DC link capacitor may have a stabilizing effect on the circuitry of the component carrier. In such a preferred embodiment, stabilization of a DC link may be advantageously achieved. In contrast to mold-type modules, the manufacture of a power module according to an exemplary embodiment of the invention as laminate-type plate-shaped component carrier provides sufficient space for accommodating one or more DC link capacitors. Preferably, at least one DC link capacitor is configured as a ceramic capacitor or an anti-ferroelectric capacitor.

In an embodiment, at least one DC link capacitor is surface mounted on the stack. Thus, a free portion of one of the main surfaces of the flat plate-shaped component carrier may be efficient for mounting one or preferably multiple DC link capacitors.

Advantageously, at least one DC link capacitor may be mounted on the same main surface of the stack on which also at least one socket and/or at least one control chip for controlling at least one of the first transistor component and the second transistor component is mounted. Such a side-by-side or juxtaposed mounting of at least two of the mentioned components on the same main surface of the component carrier results in a space saving and hence compact component carrier with high degree of electronic functionality. The remaining opposing main surface of the component carrier may then be used for the purpose of mounting a heat removal structure there.

In an embodiment, an outermost one of the electrically insulating layer structures has a higher value of thermal conductivity than at least one other of the electrically insulating layer structures located more central within the stack, in particular an outermost one of the electrically insulating layer structures is made of thermal prepreg. For instance, the electrically insulating layer structures of the stack may comprise resin such as epoxy resin, optionally in combination with reinforcing particles such as glass fibers. Such material, in particular prepreg, has advantageous properties during lamination of the stack, because a previously at least partially uncured resin material becomes temporarily flowable at elevated temperature and pressure and, after re-solidification contributes to the adhesion between the layer structures of the stack. However, such prepreg material has a limited thermal conductivity (typically below 1 W/mK, for instance FR4 may have a thermal conductivity of about 0.2-0.3 W/mK) and thereby contributes only in a limited way to the heat removal during operation of the component carrier. By the provision of a thermally highly conductive electrically insulating layer structure as an outermost dielectric layer of the component carrier, heat removal and thermal conduction may be rendered particularly appropriate at one exterior main surface of the component carrier. For example, a heat sink may be attached to such a main surface of the component carrier. Highly advantageously, the electrically insulating layer structure with the highest thermal conductivity among the dielectric layers of the stack may be connected to that side of one or both of the transistor components where the majority of heat is generated during operation. Heat removal from this critical side can therefore be significantly increased. It is highly preferred that the electrically insulating layer structure with the highest thermal conductivity among the electrically insulating layer structures of the stack is made from a thermal prepreg. Such a thermal prepreg can contribute to the adhesion of the stack (as described above), and can at the same time contribute to an efficient heat removal. For example, such a thermal prepreg may have a thermal conductivity in a range between 1 W/mK and 200 W/mK, in particular in a range between 2 W/mK and 100 W/mK, more particularly in a range between 3 W/mK and 50 W/mK.

Advantageously, the at least one of the electrically insulating layer structures having the higher value of thermal conductivity is arranged vertically between the heat removal structure on the one hand and the first transistor component and the second transistor component on the other hand. The at least one of the electrically insulating layer structures having the higher value of thermal conductivity may be thermally coupled directly with the heat removal structure and the transistor components. By taking this measure, very efficient and spatially properly controlled heat dissipation away from the thermally critical portion of the component carrier on the hot side of the transistor components via the thermal prepreg and up to the heat removal structure may be ensured.

In an embodiment, the component carrier comprises a heat removal structure, in particular a heat sink comprising cooling fins, attached to an exterior surface of the stack. For example, such a heat removal structure may be made of a thermally highly conductive material such as copper or aluminum. The heat removal structure may have a plate section connected to an exterior surface of the stack of component carrier material and may comprise a plurality of cooling fins connected to the plate and having a high surface for proper heat exchange with an environment. The plate shape of such a heat removal structure perfectly fits with a corresponding large main surface of the stack. In an embodiment, the heat removal structure may be produced by additive manufacturing, in particular three-dimensional printing.

In an embodiment, the component carrier comprises an insulation barrier insulating the first transistor component and the second transistor component from another portion of the component carrier or a connected circuity (for instance connected by plugging such a circuitry into a socket of the component carrier). This provides a reliable isolation between the two mentioned sections of the circuit.

In an embodiment, the first transistor component and the second transistor component are embedded at the same vertical level within the stack, in particular within a central core of the stack. By taking this measure, it is possible to obtain vertically very compact component carriers and to embed the transistor components in a common procedure. For instance, one or more pre-cut layer structures (for instance a pre-cut FR4 or prepreg sheet) may be provided with recesses in which the transistor components are accommodated. For example, the recesses may be closed at a bottom by a temporary carrier (such as a sticky tape or plate). The transistor components may then be embedded by lamination, followed by the removal of the temporary carrier, which may be followed, in turn, by lamination of one or more further layers. Alternatively, it is also possible to place the transistor components on a central core (preferably of already fully cured material) and to build up the stack and complete the embedding procedure by lamination with various other layer structures.

In an embodiment, the component carrier is configured as a power module or as a power stage. The transistor components may then for instance be semiconductor power chips.

In an embodiment, the first transistor component and the second transistor component may be electrically connected in parallel to one another. One of the transistor components may form a high-side switch, and the other one of the transistor components may constitute a low-side switch.

At least one further component may be surface mounted on and/or embedded in the component carrier. The at least one further component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, a logic chip, a light guide, and an energy harvesting unit. However, other components may be embedded in or surface mounted on the component carrier. For example, a magnetic element can be used as a component. Such a magnetic element may be a permanent magnetic element (such as a ferromagnetic element, an antiferromagnetic element or a ferrimagnetic element, for instance a ferrite coupling structure) or may be a paramagnetic element. However, the component may also be a further component carrier, for example in a board-in-board configuration.

As mentioned above, the component carrier may comprise a stack of at least one electrically insulating layer structure and/or at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid-crystal polymer (LCP), epoxy-based Build-Up Film, polytetrafluoroethylene, a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid-crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier is a laminate-type body. In such an embodiment, the component carrier is a compound of multiple layer structures which are stacked and connected together by applying a pressing force, if desired accompanied by heat.

DETAILED DESCRIPTION OF ILLUSTRATED EMBODIMENTS

Figure 1:
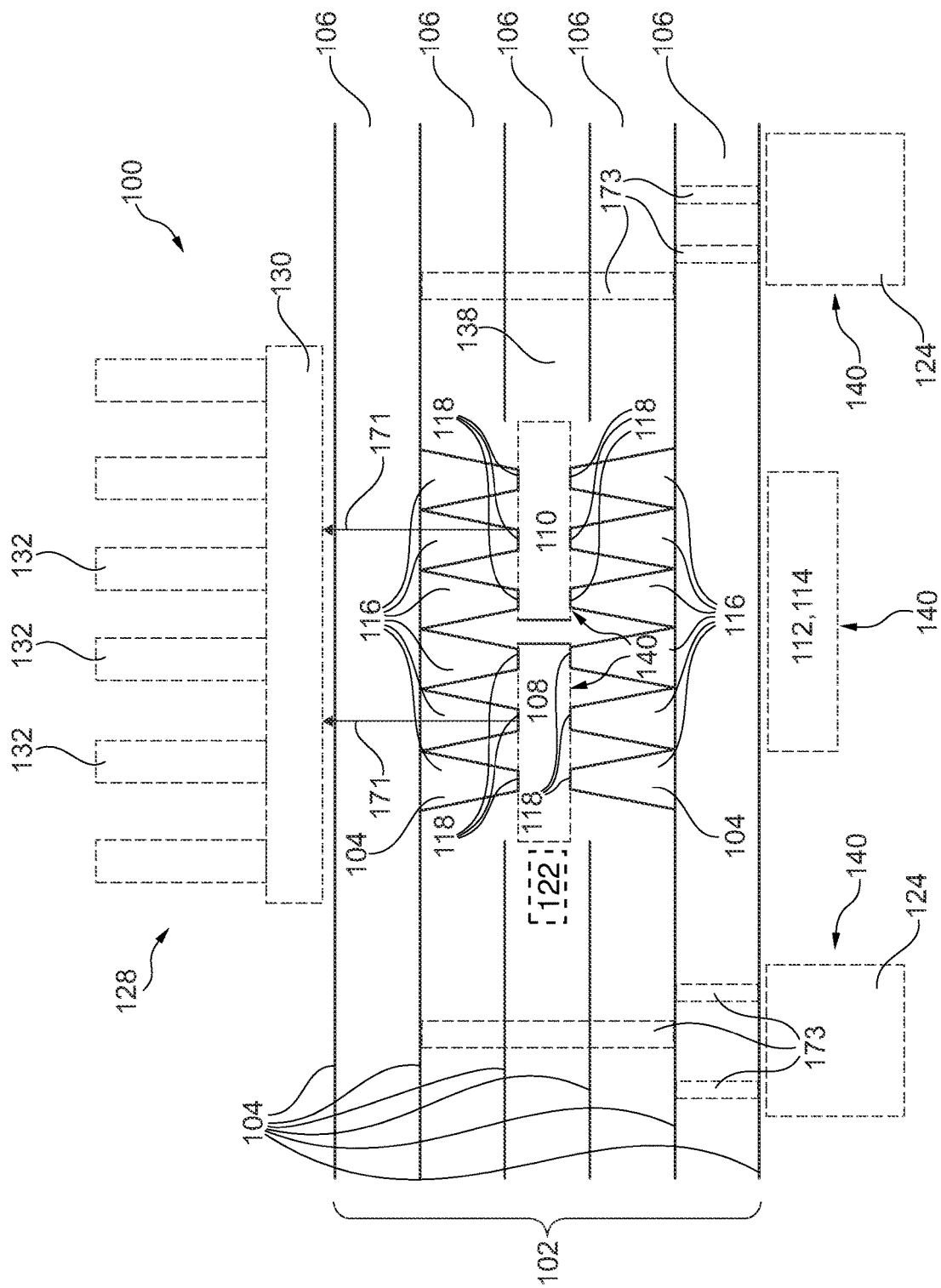
FIG. 1, FIG. 2, FIG. 3 and FIG. 4 illustrate cross-sectional views of component carriers according to exemplary embodiments of the invention.

The aspects defined above and further aspects of the invention are apparent from the examples of embodiment to be described hereinafter and are explained with reference to these examples of embodiment.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

Power electronics are getting more and more complex. Designers of converters or inverters have to have deep knowledge about topics like EMI (electromagnetic interference), thermal conductivity and also passive parts (for instance inductors, capacitors). In the 1990s, the switching speed of power electronics was below 5 kHz, because faster switching caused high power losses in transistors and also in a main inductor of a converter.

Modern electric circuits are capable of handling up to 5 MHz switching frequency for power converters (on chip level). Such switching speeds combined with thermal management and EMI issues need long development times.

To overcome such issues, an exemplary embodiment of the invention provides a component carrier which may be implemented in modular power electronic technology and offers a simple solution. In particular the following advantages can be achieved:

an integrated and hence compact design can be accomplished;

an easy implementation in terms of design may be achieved;

an appropriate management may be obtained, also in view of the availability of different thermal designs (depending on maximum requirements of a certain application);

there is the opportunity of implementing an integrated NTC (negative temperature coefficient) member for temperature measurement and/or control;

a DC link voltage up to 600 V or more is possible;

a very high switching frequency (for instance 100 kW or more, in particular up to 1 MHz or more) is possible; correspondingly, a high switching speed depending on generated losses may be achieved;

interlock delay is not fixed;

replacement is easy;

the component carrier may be used like an integrated circuit or a black box, which renders the component carrier very convenient for a user; and/or the component carrier may be used as a tool for development of new products.

According to an exemplary embodiment of the invention, a component carrier configured as a laminate based fully integrated power stage is provided. In particular, such a component carrier may be embodied as an integrated half-bridge power stage. When configured for an application in power electronics, switched power supplies may be implemented in an electronic device according to an exemplary embodiment of the invention. This means that at least one half-bridge power stage (two transistors connected in series) may be used. An exemplary embodiment may particular provide a gate control circuit, a heat management system, and an EMI protection mechanism. A component carrier according to an exemplary embodiment may be based on a modular design. It is in particular possible to combine different modules which may lead to a shortened development time, an easy concept and a reliable product.

An exemplary embodiment of the invention is based on a single half bridge including driver, heat management and a thermal measurement device to observe temperature. In case of overload events, an external control algorithm can counteract.

A module provided as such a component carrier is universally useable and can be configured as it is necessary for a certain application. In particular, one or more of the following features can be implemented:

full isolation between control and power circuit;

maximum current capability adjusted by an assembled heat sink;

extended power level by additional fan; and/or interlock delay adjusted by external control (to improve or even optimize switching losses).

In particular when GaN transistors are implemented as transistor components or transistor chips in the component carrier according to an exemplary embodiment, high switching frequencies can be handled which leads to small filter designs (in particular since inductor size and weight can be reduced). Also input and output capacitors can be reduced in capacitance value. This reduces energy stored inside the converter.

Exemplary embodiments of the invention are usable like an integrated circuit and have internal isolation between control circuits and power circuits. Besides this, also a highly efficient heat management is obtained.

Exemplary applications of exemplary embodiments of the invention are related to a photovoltaic inverter, battery cell testing units, laboratory equipment, motor inverters (industry and automobile), etc.

A component carrier according to an exemplary embodiment of the invention configured as a module may, for example, only contain two half-bridge transistor components and one or more corresponding driver devices or control chips. Besides the power devices, an NTC thermistor may be mounted as a temperature sensor component to get information about an actual heat sink temperature, or any other temperature on and/or in the component carrier.

FIG. 1 illustrates a cross-sectional view of a plate-shaped laminate-type component carrier 100 according to exemplary embodiments of the invention, which is here embodied as a printed circuit board (PCB) and which is configured as a power stage.

The component carrier 100 illustrated in FIG. 1 comprises a laminated stack 102 composed of a plurality of electrically conductive layer structures 104 and a plurality of electrically insulating layer structures 106. In the shown embodiment, the electrically conductive layer structures 104 are made of copper. The electrically conductive layer structures 104 comprise complete or patterned electrically conductive layers, for instance copper foils. The electrically conductive layer structures 104 also comprise vertical interconnect structures embodied as copper vias 116. The latter are formed by drilling holes (for instance by laser drilling) and by filling the drilled holes (partially, for instance by coating only the walls, or preferably entirely for increasing the current carrying capability) with copper (for instance by plating). In addition, mechanically drilled bores are shown which are filled partially or entirely within electrically conductive material such as copper, see reference numerals 173. The electrically insulating layer structures 106 may comprise resin (such as epoxy resin) filled with reinforcing particles (such as glass fibers) and may for example be prepreg or FR4.

A first transistor component 108 is provided which is here embodied as a semiconductor chip, in particular as die with a monolithically integrated HEMT (high electron mobility transistor) in GaN (gallium nitride) technology. Correspondingly, a second first transistor component 110 is provided which is here embodied as a further semiconductor chip, in particular as further die with a further monolithically integrated HEMT (high electron mobility transistor) in GaN (gallium nitride) technology. As can be taken from FIG. 1, the first transistor component 108 and the second transistor component 110 are embedded laterally or side-by-side and at the same vertical level as well as within and between the same layer structures 104, 106 of the stack 102. More specifically, the first transistor component 108 and the second transistor component 110 being embedded at the same vertical level within the stack 102 are positioned within a central core 138 (for instance made of FR4) of the stack 102. A corresponding embedding procedure may be center core embedding in which the respective transistor component 108, 110 may be placed in the middle of the PCB core 138 and may be connected by the laser vias 116 to layer-type electrically conductive layer structures 104. According to FIG. 1, the upper main surfaces of the transistor components 108, 110 are in flush with one another or are aligned with each other. Correspondingly, the lower main surfaces of the transistor components 108, 110 are in flush with one another or are aligned with each other. This promotes a flat and vertically compact configuration of the component carrier 100, ensures a close vicinity of all main surfaces of the transistor components 108, 110 with regard to the exterior main surfaces of the component carrier 100 and thereby also contributes to a proper removal of heat generated by the transistor components 108, 110 during operation of the component carrier. Pads 118 at the main surfaces of the transistor components 108, 110 get heated during operation of the component carrier 100. As a result, pads 118 emit heat in particular and predominantly along a direction 171 indicated by arrows according to FIG. 1 (as a consequence of the internal construction of the transistor components 108, 110). The first transistor component 108 and the second transistor component 110 are connected to form a half bridge circuit, compared FIG. 5.

Figure 5:
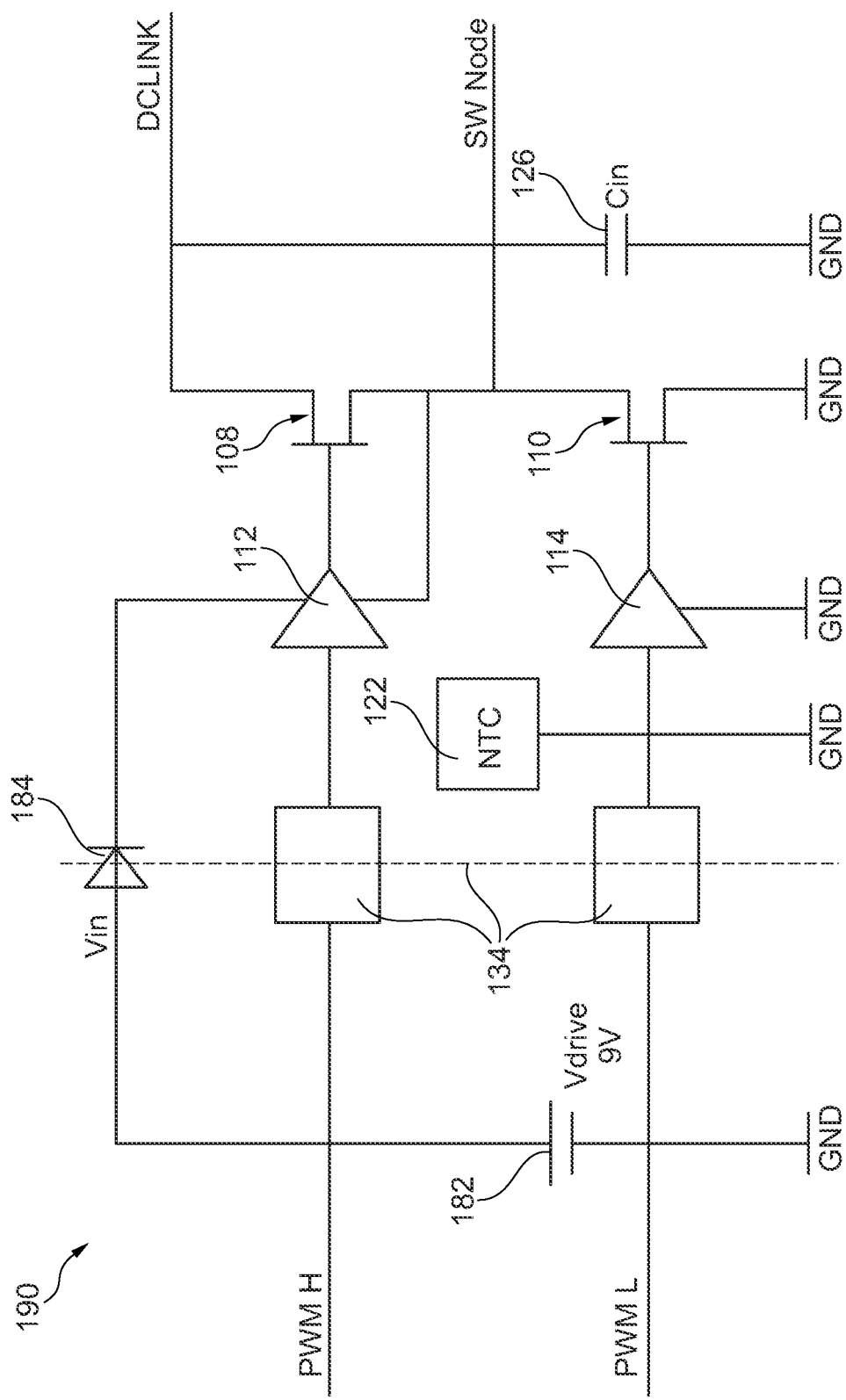
FIG. 5 illustrates a circuit diagram of a component carrier according to an exemplary embodiment of the invention.

The component carrier 100 furthermore comprises one or two control chips 112, 114 configured for controlling the first transistor component 108 and the second transistor component 110, respectively (compare FIG. 5). In FIG. 1, only one of these control chips 112, 114 is shown and is surface mounted on the stack 102 (the other one may also be surface mounted or may be embedded within the stack 102). Although not shown in FIG. 1 in detail, the control chips 112, 114 may be electrically coupled with the transistor components 108, 110 in the way as shown in FIG. 5 via the electrically conductive layer structures 104 of the stack 102.

As already mentioned, a plurality of copper vias 116 are provided as vertical interconnect structures and therefore extend vertically through corresponding portions of the stack 102 for electrically contacting pads 118 of the first transistor component 108 and the second transistor component 110 with one another, with the control chips 112, 114, as well as with other terminals of the component carrier 100. The vias 116 furthermore serve, apart from their described electric function, simultaneously as heat removing features contributing to the heat removal out of the component carrier 100, and in particular along direction 171.

Sockets 124 are provided as surface mounted devices and are mounted on a lower main surface of the stack 102 (opposing the upper main surface of the stack 102 at which a heat removal structure 128 is attached). The sockets 124 are configured for plugging in a respective plug (not shown) for establishing a mechanical and electric connection with another electronic member (not shown). The socket 124 shown on the left-hand side of FIG. 1 can be configured as a control connector, whereas the other socket 124 shown on the right hand side of FIG. 1 can be configured as a power connector.

As already mentioned, the heat removal structure 128 is attached to the upper main surface of the stack 102 to further promote heat dissipation from an interior of the component carrier 100. In the shown embodiment, the heat removal structure 128 is configured as a heat sink with a plate section 130 thermally connected with a large plurality of cooling fins 132 attached to an exterior surface of the stack 102. It is also possible to mount a fan for producing a cooling airflow at the respective main surface of the component carrier 100. Further alternatively, the illustrated heat removal structure 128 may be substituted by a heat pipe for supporting heat removal. According to yet another exemplary embodiment, the heat removal structure 128 may also be integrated, partially or entirely, in an interior of the stack 104. In the shown embodiment, the heat removal power may be for instance 15 W, or even up to 50 W and more.

As can be taken from reference numerals 112, 114, 124 in FIG. 1, a plurality of components 140 are surface mounted on an exterior surface of the stack 102. Also the transistor components 108, 110 are provided as components 140 of the component carrier 100, which are however embedded in an interior of the stack 102. Although not shown in FIG. 1, one or more additional components 140 may be surface mounted on and/or embedded in the stack 102 to provide an additional (for instance electronic and/or thermal) functionality.

For example, one or more temperature sensor components 122, which may be embodied as a NTC thermistor, may be embedded and/or surface mounted in or on the stack 102 for locally sensing information indicative of a temperature in or on the stack 102.

Figure 2:
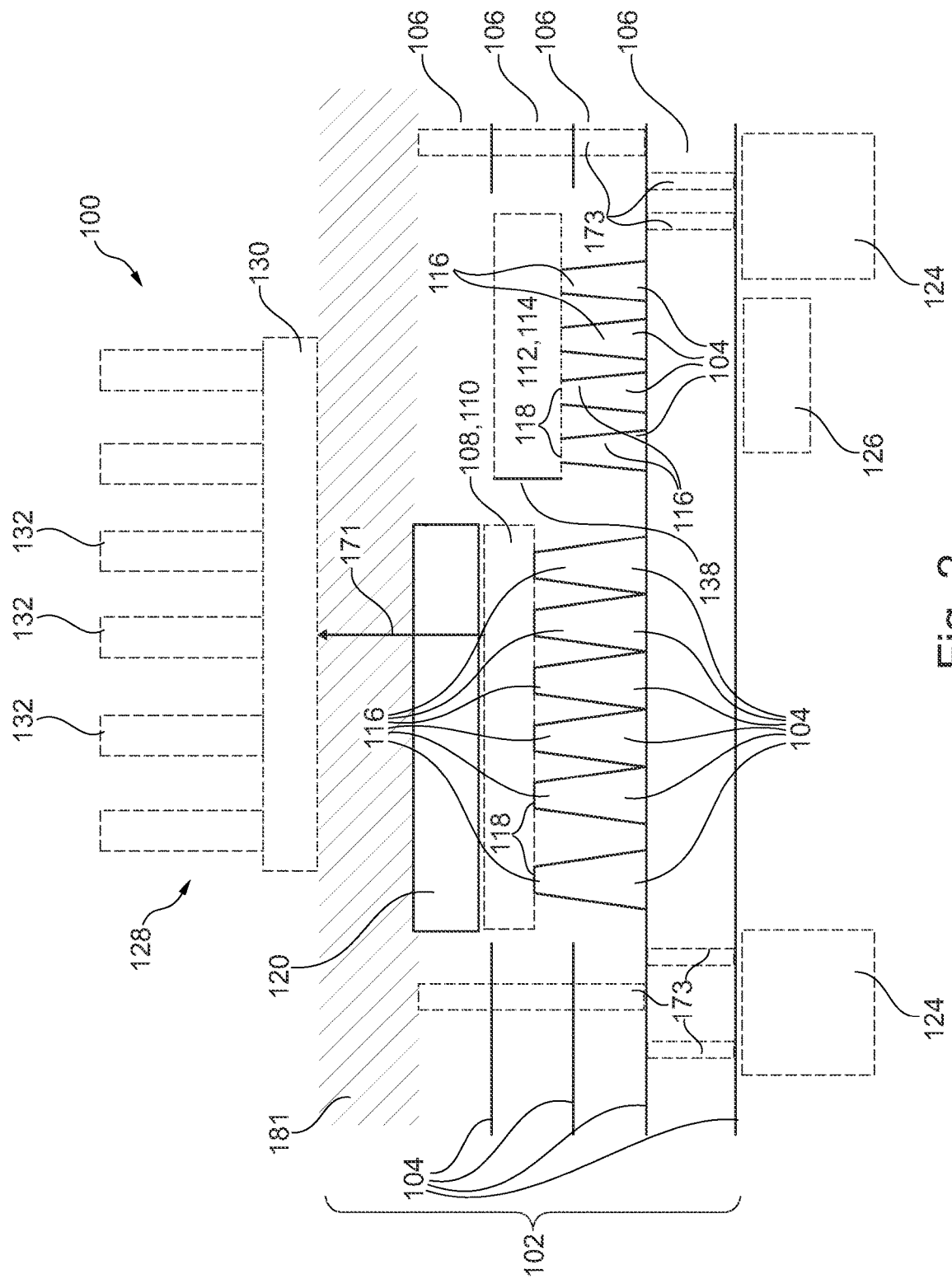

FIG. 2 illustrates a cross-sectional view of a component carrier 100 according to another exemplary embodiment of the invention.

The embodiment according to FIG. 2 differs from the embodiment according to FIG. 1 in that, according to FIG. 2, also the control chips 112, 114 are embedded in the stack 102, more specifically substantially side-by-side with the first transistor component 108 and the second transistor component 110 (the latter two are drawn in FIG. 2, for the sake of simplicity, as one common block, but may be embodied as two separate blocks arranged side-by-side and at the same vertical level as shown in FIG. 1 as well). Thus, rather than being surface mounted, also the control chips 112, 114 are embedded in the stack 102 according to FIG. 2 to further reduce the vertical height of the component carrier 100.

A further difference between the embodiment of FIG. 2 and the embodiment of FIG. 1 is that a part of the laser vias 116 (more precisely the laser vias 116 extending upwardly from the first transistor component 108 and the second transistor component 110 in FIG. 1) are substituted by an electrically conductive sheet 120 or plate, here embodied as solid copper body, for electrically contacting substantially the complete upper main surface of the first transistor component 108 and the second transistor component 110. This full area surface connection not only increases the current carrying capability of the component carrier 100, but at the same time additionally improves the heat removal performance of the component carrier 100.

As a further difference and as indicated with reference numeral 181, the outermost and uppermost one of the electrically insulating layer structures 106 is made of another material than the remaining electrically insulating layer structures 106. More precisely, this outermost one of the electrically insulating layer structures 106 indicated with reference numeral 181 is made of a thermal prepreg with a significantly higher value of thermal conductivity (for instance at least 2 W/mK) than the other electrically insulating layer structures 106 (for instance having a value of thermal conductivity less than 1 W/mK) of the stack 102. The electrically insulating layer structure 106 indicated with reference numeral 181 may be made of thermal prepreg, whereas the other electrically insulating layer structures 106 may be made of ordinary thermal prepreg.

Advantageously, the only electrically insulating layer structure 106 made of thermal prepreg (see reference numeral 181) is arranged vertically directly between the heat removal structure 128 on the one hand and the sheet 120 attached to the first transistor component 108 and the second transistor component 110 on the other hand. Advantageously, this creates an extremely efficient heat removal path from the transistor components 108, 110 via the sheet 120 and the electrically insulating layer structure 106 of thermal prepreg up to the heat removal structure 128. Thereby, heat removal along the critical direction 171 can be further promoted by the combinatory effect of electrically conductive sheet 120 and electrically insulating layer structure 106 indicated with reference numeral 181 as well as the heat removal structure 128.

Yet another difference between FIG. 1 and FIG. 2 is that, according to FIG. 2, a DC (direct current) link capacitor 126 (which may be configured as ceramic capacitor or anti-ferroelectric capacitor) is surface mounted on the lower surface of the stack 102. The DC link capacitor 126 advantageously stabilizes DC current and can be implemented without an increase of the vertical dimension of the component carrier 100, see FIG. 2.

Figure 3:
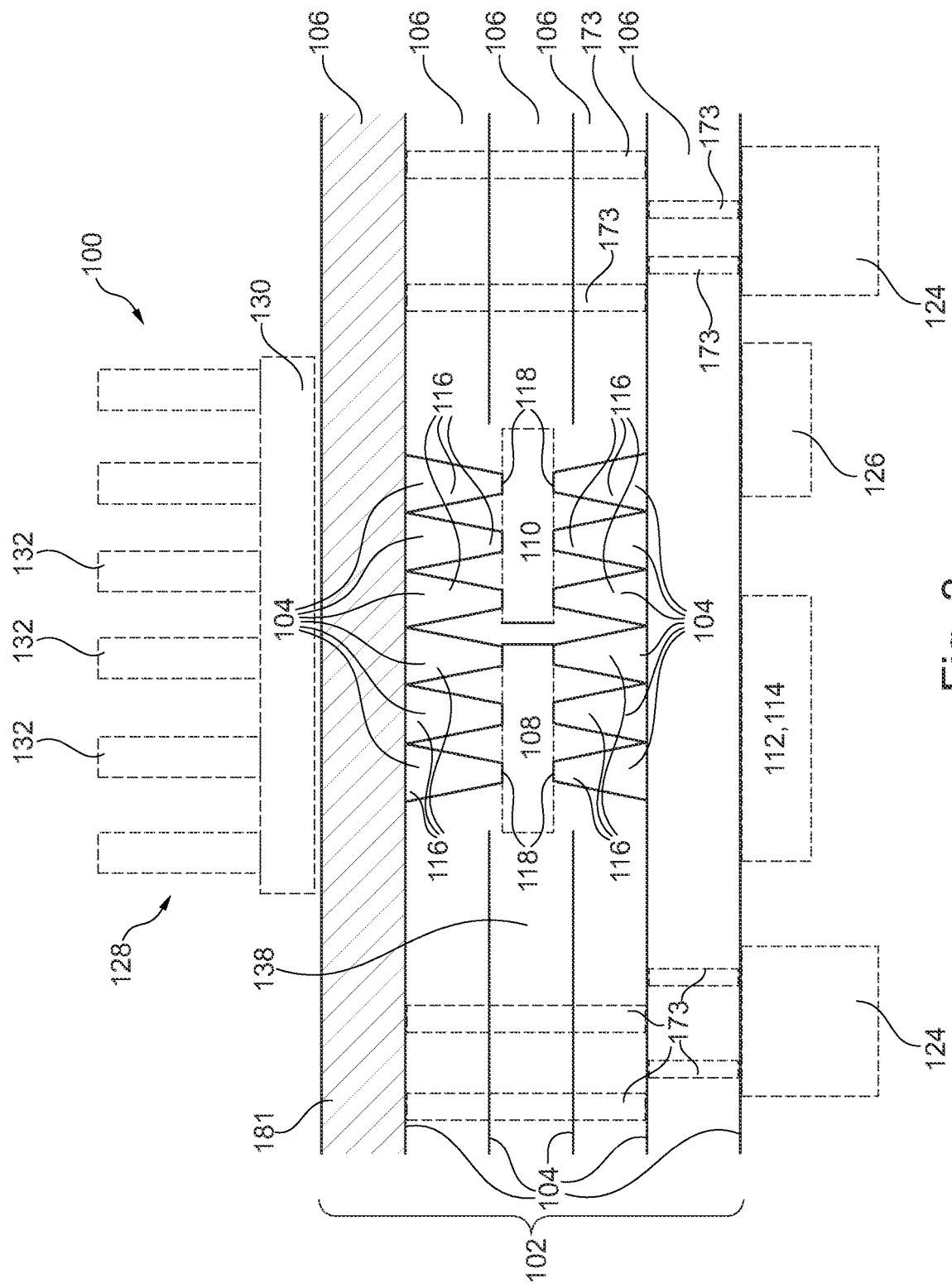

FIG. 3 illustrates a cross-sectional view of a component carrier 100 according to still another exemplary embodiment of the invention.

According to FIG. 3, compared to FIG. 1, the layer of thermal prepreg denoted with reference numeral 181 is implemented as well as described referring to FIG. 2, and DC link capacitor 126 is provided surface mounted on the lower main surface of the stack 102, as in FIG. 2.

Figure 4:
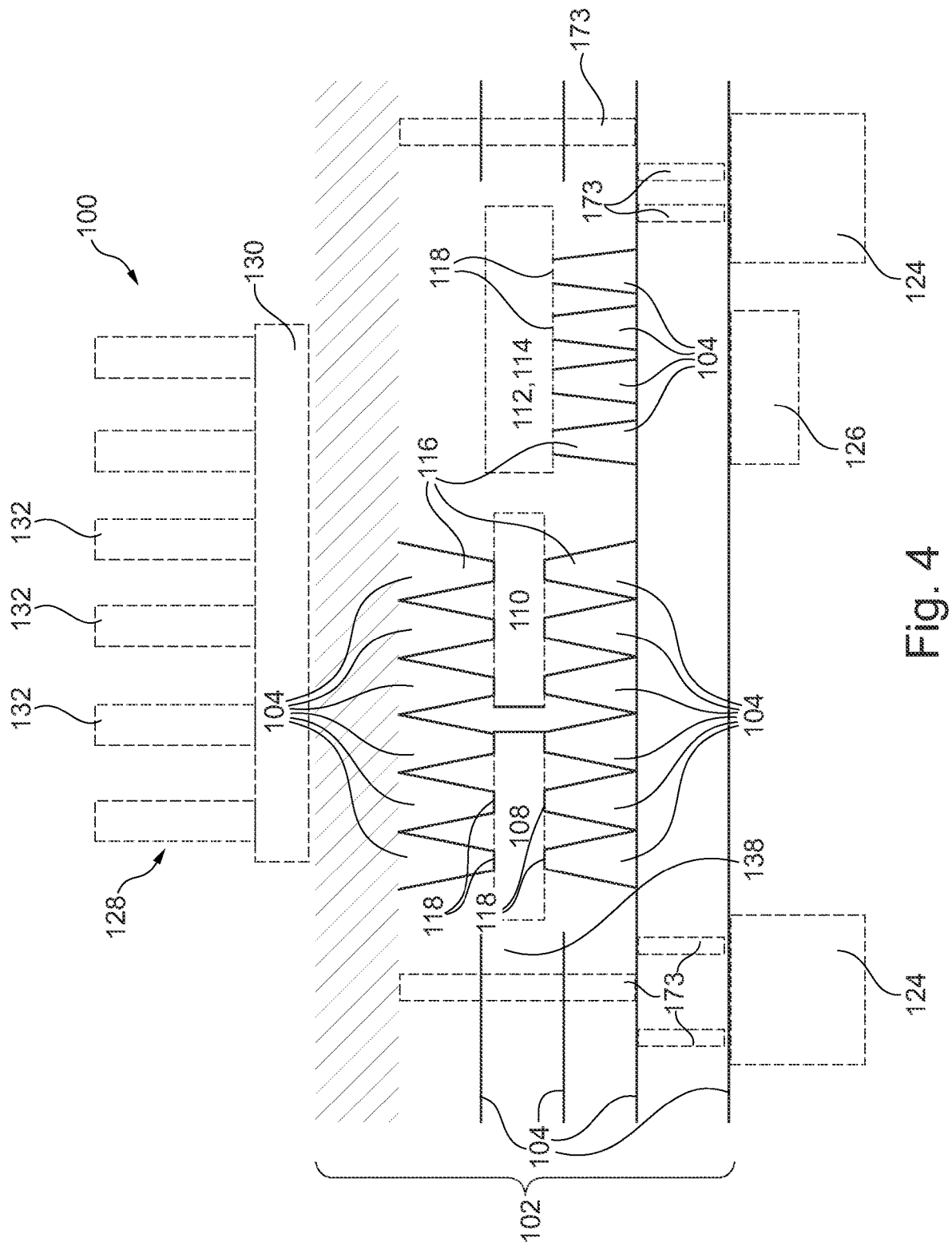

FIG. 4 illustrates a cross-sectional view of a component carrier 100 according to yet another exemplary embodiment of the invention.

The embodiment of FIG. 4 is very similar to the embodiment of FIG. 2 with the difference that the electrically conductive sheet 120 according to FIG. 2 is substituted by vertical vias 116 according to FIG. 4.

FIG. 1 through FIG. 4 therefore show that various combinations of different features are possible in different embodiments of the invention.

FIG. 5 illustrates a circuit diagram 190 of a component carrier 100 according to an exemplary embodiment of the invention which provides an electronic half bridge function. The embodiments of FIG. 1 to FIG. 4 may implement features shown in FIG. 5, and vice versa.

In particular, FIG. 5 shows that a component carrier 100 according to an exemplary embodiment of the invention may comprise an insulation barrier 134 between the first transistor component 108 and the second transistor component 110 on the one hand, and another portion of the circuit on the other hand.

Furthermore, one or more optional but advantageous temperature sensor components 122, which may be embodied as a NTC thermistor, may be embedded and/or surface mounted in the stack 102 for locally sensing information indicative of a temperature in or on the stack 102. Although not shown in all figures, one or more temperature sensor components 122 may be provided in each and every of the embodiments shown in the figures. The component carrier 100 may furthermore be configured for reducing power or for switching off the first transistor component 108 and/or the second transistor component 110 when information sensed by the one or more temperature sensor components 122 indicates overheating of the stack 102. After overheating has vanished by heat removal, the one or more temperature sensor components 122 may detect this as a temperature decrease, and this may trigger the first transistor component 108 and/or the second transistor component 110 to be switched on again.

Moreover, FIG. 5 illustrates a drive voltage source 182, a bootstrap diode 184, and DC link capacitor 126 (see Cin).

Hence, FIG. 5 shows a block diagram of the electronic functionality of a component carrier 100 according to an exemplary embodiment of the invention configured as half bridge. As illustrated in FIG. 5, the shown control lines, the temperature sensor component 122, drive voltages as the GNDs (grounds) are connected to one pin header placed on the left edge of the module type component carrier 100.

The pin header contains the following signals:

Vin (signal side of driver)

Vdrive (drive voltage for the MOSFET)

PWM (pulse width modulation) for low-side ("PWM L") and high-side ("PWM H") transistors

NTC

Signal GND

Power GND

The rest of the module pin headers (at the right edge of the illustrated module) are power conductors (DC Link, Switched Node (SW), Power GND).

To provide isolation between the signal processing unit and the power circuit, the isolation barrier 134 can be used. The block diagram shows the function: The chip may be optimized to handle frequencies up to 1 MHz with a 4A driver stage on the output. A 2.5 kVrms isolation may be enough for a 600 V application.

What concerns the gate drive, two resistors between driver and gate may be limiting the slew rate for turn-on and turn-off. For switching on, a resistor of 22Ω may be used, and for switch-off a 2.2Ω resistor may be used. The 2.2Ω value should be selected with care, because this resistance value also influences the Miller effect. If the Miller capacity is getting charged, the MOSFET can turn on and cause a shoot-trough in the bridge. Low resistance may counteract this effect.

Additional to the gate drive, a 10 kΩ resistance may be implemented which pulls the gate low during start up.

To keep the gate drive voltage constant, a LDO (low-dropout regulator) may regulate at both drivers the input voltage to 6 kV. During reverse conducting mode, the source-drain voltage of the low-side MOSFET may be added to the drive voltage of the high side, which causes voltages higher than 7 V and might therefore cause a malfunction of the high-side transistor. In this module, a BGA (ball grid array) version of an adjustable voltage regulator may be used, because of high-input voltage and small output currents which makes it appropriate for this application.

What concerns the bootstrap circuit, for driving the high-side MOSFET in this application, a bootstrap circuit may be used to keep the module small. In some applications, a static high-side turn on may be desired, but this needs also an isolated DC/DC converter which involves challenges for realizing the same in small areas. A small diode capacitance is advantageous. The module may advantageously use a SiC diode (as commercialized for example by Wolfspeed).

Referring to the implemented input capacitor, the DC link capacitor 126 installed on this module is provided to supply power during the fast switching operation (for instance about 20 ns) and is not a complete input filter.

Depending on the desired application, an external input filter may be implemented.

In terms of different operation modes, the module may be used in particular with the following configurations:

1. Isolation between signal ground and power ground
2. Non-isolated mode (low-budget configuration)

In case of operation mode 1, an external DC/DC converter for generating 9V Vdrive can be installed. To power the module from the control circuit an isolated Vdrive (against power ground) can be generated.

If no isolation is desired (operation mode 2), no external components are necessary. On a control connector, the signal ground and the power ground can be connected. The power supply may be generated by the control circuit.

Figure 6:
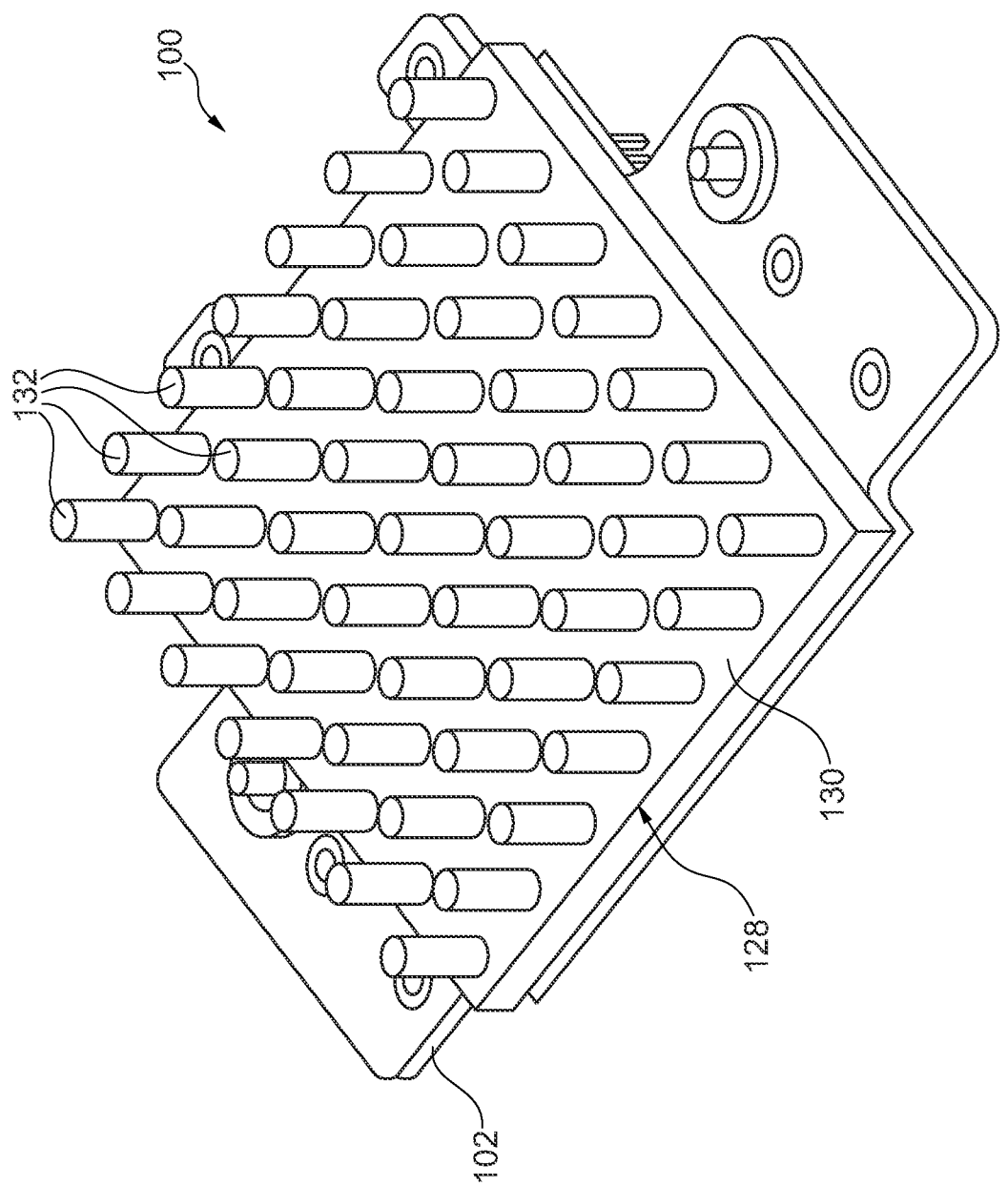
FIG. 6 illustrates a three-dimensional view of a component carrier according to an exemplary embodiment of the invention.

FIG. 6 illustrates a three-dimensional view of a component carrier 100 according to an exemplary embodiment of the invention.

In FIG. 6, the heat removal structure 128 shown in FIG. 1 to FIG. 4 in a cross-sectional view is illustrated in more detail. As can be taken from FIG. 6, the cooling fins 132 of the heat removal structure 128 may be arranged in a matrix like pattern, i.e. in rows and columns, with gaps in between. An airflow is enabled along the gaps which ensures a proper heat exchange between the cooling fins 132 and the flowing air. FIG. 6 furthermore shows that the geometry of the PCB type stack 102 and the plate section 130 of the heat removal structure 128 perfectly fit to one another and enable a large heat exchange area.

Figure 7:
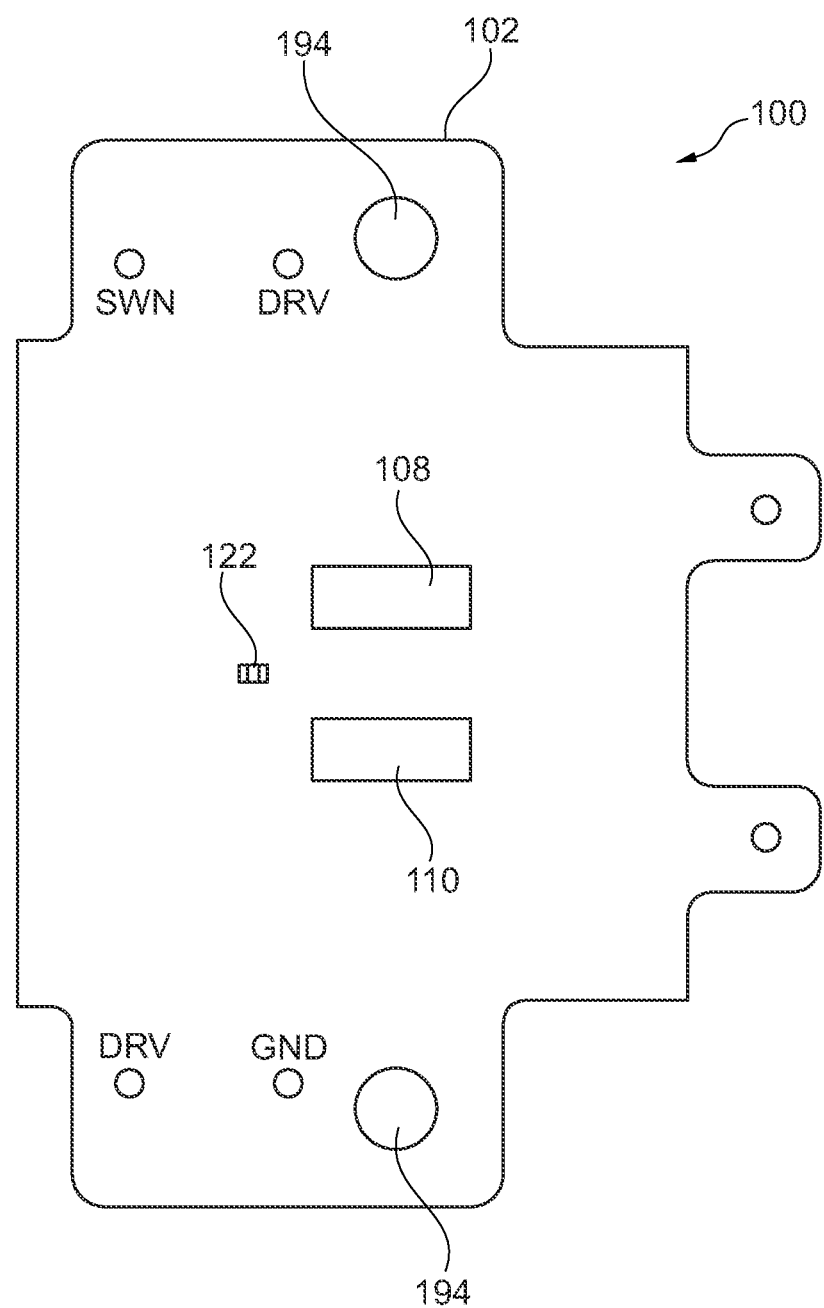
FIG. 7 illustrates a plan view of a front side of a component carrier according to an exemplary embodiment of the invention.

FIG. 7 illustrates a plan view of a front side of a component carrier 100 according to an exemplary embodiment of the invention.

The transistor components 108, 110 as well as the thermally conductive component 122 are embedded in an interior of the stack 102. However, their position is shown for the sake of clarity in FIG. 7. Moreover, mounting holes 194 for mechanically mounting the shown component carrier 100 on another device are provided as illustrated in FIG. 7 as well.

Figure 8:
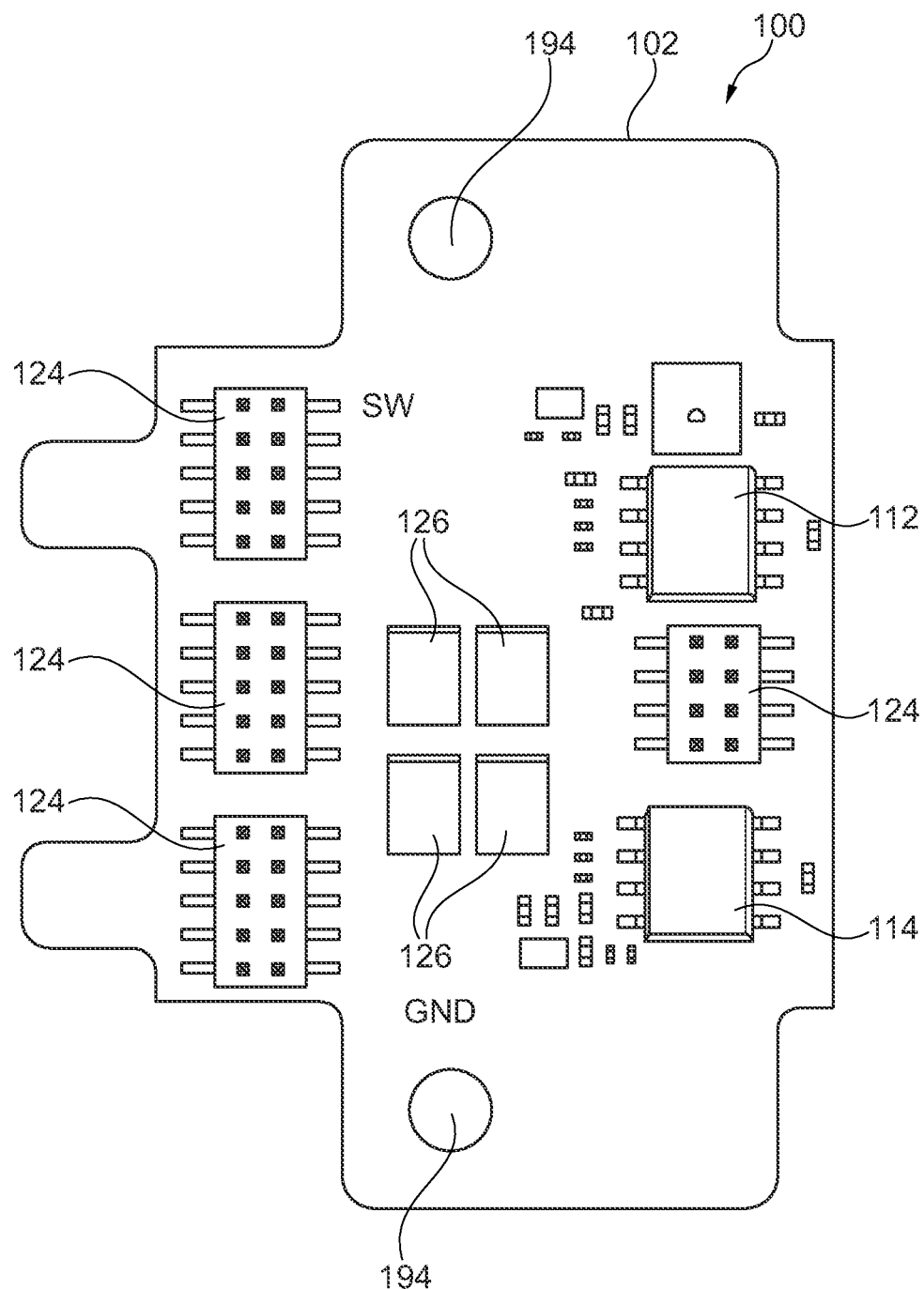
FIG. 8 illustrates a plan view of a backside of a component carrier according to an exemplary embodiment of the invention.

FIG. 8 illustrates a plan view of a backside of the component carrier 100 according to FIG. 7, having a similar construction as shown in FIG. 3.

FIG. 8 illustrates a number of surface mounted components of the component carrier 100: the socket 124 for the switching node (uppermost socket 124 on the left-hand side in FIG. 8), the socket 124 for the DC link (socket 124 in the middle on the left-hand side in FIG. 8), the socket 124 for GND (lowermost socket 124 on the left-hand side in FIG. 8), the socket 124 for control (socket 124 on the right-hand side in FIG. 8), four DC link capacitors 126, and the two surface mounted control chips 112, 114 for driving the transistor components 108, 110.

Figure 9:
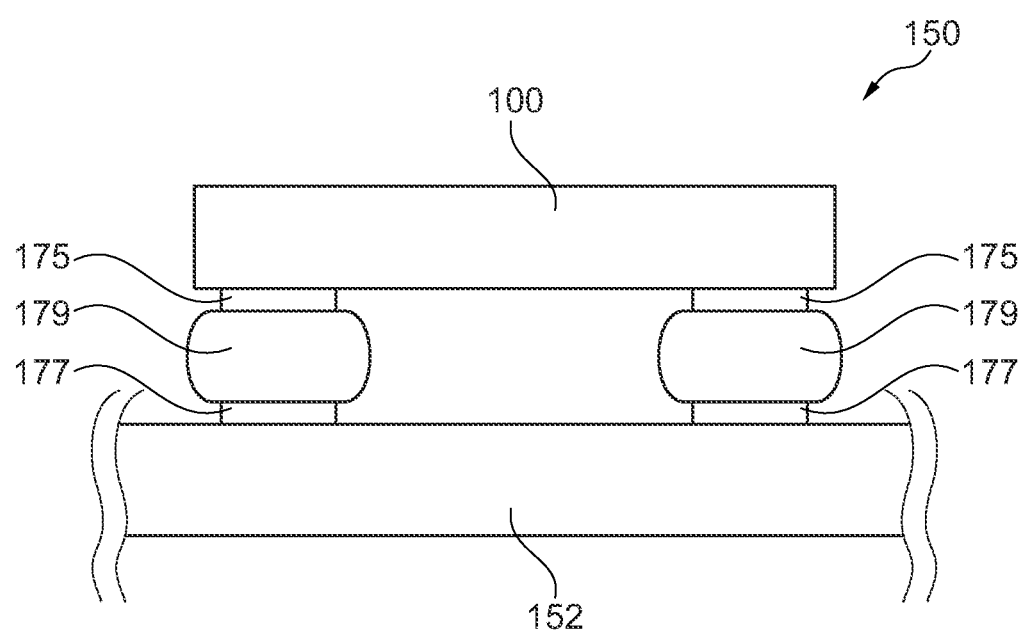
FIG. 9 illustrates a cross-sectional view of an electronic device comprising a component carrier according to an exemplary embodiment of the invention.

FIG. 9 illustrates a cross-sectional view of an electronic device 150 comprising a component carrier 100 according to an exemplary embodiment of the invention.

The illustrated electronic device 150 comprises a mounting body 152 which is here embodied as a printed circuit board (PCB). A component carrier 100 with a composition as described above is mounted on the mounting body 152. This mounting can be carried out by soldering of pads 175 of the component carrier 100 with pads 177 of the mounting base 152 via solder structures 179.

As an alternative to connecting the mounting base 152 with the component carrier 100 by soldering, it is also possible to contact mounting base 152 with the component carrier 100 by plugging plugs of the mounting base 152 into the sockets 124 of the component carrier 100. Further alternatively, it is also possible that the component carrier 100 is embedded in a component carrier type mounting base 152, to thereby obtain a board-in-board configuration. Further alternatively, the component carrier 100 may be accommodated within a casing or a mold.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A component carrier, comprising:
   a stack comprising a plurality of electrically conductive layer structures and/or electrically insulating layer structures;

a first transistor component and a second transistor component embedded side-by-side along a direction of main extension of the component carrier in the stack;
wherein the first transistor component and the second transistor component are embedded at the same vertical level within a central core layer of the stack, and wherein the central core layer comprises a thickness that is larger than the thickness of the first transistor and is larger than the thickness of the second transistor;
at least one control chip configured for controlling at least one of the first transistor component and the second transistor component,
wherein the at least one control chip is surface mounted on the stack; and
at least one temperature sensor component embedded in the stack for sensing information indicative of a temperature in the stack;
wherein the at least one temperature sensor component is embedded in an electrically insulating layer structure which comprises at least one of the group consisting of resin, reinforced or non-reinforced resin, epoxy resin or Bismaleimide-Triazine resin, FR-4, FR-5, cyanate ester, polyphenylene derivate, prepreg material, polyimide, polyamide, liquid-crystal polymer, epoxy-based Build-Up Film, polytetrafluoroethylene;
wherein the component carrier is configured for reducing power or switching off at least one of the first transistor component and the second transistor component when information sensed by the at least one temperature sensor component indicates overheating.

2. The component carrier according to claim 1, wherein the first transistor component and the second transistor component are connected to form a half-bridge circuit.

3. The component carrier according to claim 1, further comprising:
a second control chip configured for controlling the first transistor component and/or the second transistor component.

4. The component carrier according to claim 3, wherein at least one of the control chips is embedded in the stack side-by-side with the first transistor component and the second transistor component.

5. The component carrier according to claim 1, further comprising:
a plurality of vias, extending vertically through at least part of the stack and electrically contacting at least one pad of at least one of the first transistor component and the second transistor component.

6. The component carrier according to claim 5,
wherein at least one of the plurality of vias provides a direct heat dissipation path from an upper surface of the first transistor and/or the second transistor to an outer dissipation structure.

7. The component carrier according to claim 6,
wherein the at least one via is a cone-shaped copper via.

8. The component carrier according to claim 1, further comprising:
at least one electrically conductive sheet directly electrically contacting at least part of a main surface of at least one of the first transistor component and the second transistor component.

9. The component carrier according to claim 1, further comprising:
at least one socket on a main surface of the stack configured for receiving a pin header.

10. The component carrier according to claim 1, further comprising:
at least one DC link capacitor.

11. The component carrier according to claim 10, comprising at least one of the following features:
wherein the at least one DC link capacitor is configured as a ceramic capacitor or anti-ferroelectric capacitor;
wherein the at least one DC link capacitor is surface mounted on a main surface of the stack on which also at least one socket and/or at least one control chip for controlling at least one of the first transistor component and the second transistor component is mounted.

12. The component carrier according to claim 1, comprising at least one of the following features:
at least one outermost one of the electrically insulating layer structures has a higher value of thermal conductivity than at least one other of the electrically insulating layer structures of the stack;
wherein the at least one other of the electrically insulating layer structures of the stack is made of thermal prepreg;
a heat removal structure including having cooling fins, attached to an exterior surface of the stack, wherein the at least one of the electrically insulating layer structures having the higher value of thermal conductivity is arranged vertically between the heat removal structure on the one hand and the first transistor component and the second transistor component on the other hand;
an insulation barrier insulating the first transistor component and the second transistor component from another portion of the component carrier or connected circuitry;
wherein the first transistor component and the second transistor component are embedded at the same vertical level within a central core of the stack;
wherein the component carrier is configured as a power module;
at least one further component mounted on and/or embedded in the at least one electrically insulating layer structure and/or the at least one electrically conductive layer structure, wherein the at least one further component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, a magnetic element, a further component carrier and a logic chip;
wherein at least one of the electrically conductive layer structures comprises at least one of the group of materials consisting of copper, aluminum, nickel, silver, gold, palladium, and tungsten, any of the mentioned materials being optionally coated with supra-conductive material such as graphene;
wherein the component carrier is shaped as a plate;
wherein the component carrier is configured as one of the group consisting of a printed circuit board, and a substrate;
wherein the component is configured as a laminate-type component carrier;

wherein the first transistor component and the second transistor component are electrically connected in parallel to one another.

13. The component carrier according to claim 1, wherein the central core layer is a single solid layer.

14. An electronic device, comprising:
a mounting body including a printed circuit board;
a component carrier including a stack having a plurality of electrically conductive layer structures and/or electrically insulating layer structures with a first transistor component and a second transistor component embedded side-by-side along a direction of main extension of the component carrier in the stack;
wherein the first transistor component and the second transistor component are embedded at the same vertical level within a central core layer of the stack, and wherein the central core layer comprises a thickness that is larger than the thickness of the first transistor and is larger than the thickness of the second transistor;
at least one control chip configured for controlling one of the first transistor component and the second transistor component,
wherein the at least one control chip is surface mounted on the stack,
wherein the component carrier is mounted on and/or embedded in the mounting body,
wherein a sensor embedded in the stack senses information indicative of a temperature in the stack;
wherein the component carrier is configured for reducing power or switching off at least one of the first transistor component and the second transistor component when information sensed by the at least one temperature sensor component indicates overheating.

15. A method of manufacturing a component carrier, the method comprising:
forming a connected stack comprising a plurality of electrically insulating layer structures and/or electrically conductive layer structures;
embedding a first transistor component and a second transistor component side-by-side along a direction of main extension of the component carrier in the stack,
wherein the first transistor component and the second transistor component are embedded at the same vertical level within a central core layer of the stack, and wherein the central core layer comprises a thickness that is larger than the thickness of the first transistor and is larger than the thickness of the second transistor;
surface mounting at least one control chip on the stack,
wherein the at least one control chip is configured for controlling at least one of the first transistor component and the second transistor component;
embedding at least one temperature sensor component in the stack for sensing information indicative of a temperature in the stack,
wherein the at least one temperature sensor component is embedded in an electrically insulating layer structure which comprises at least one of the group consisting of resin, reinforced or non-reinforced resin, epoxy resin or Bismaleimide-Triazine resin, FR-4, FR-5, cyanate ester, polyphenylene derivate, prepreg material, polyimide, polyamide, liquid-crystal polymer, epoxy-based Build-Up Film, polytetrafluoroethylene; and
reducing power or switching off at least one of the first transistor component and the second transistor component when information sensed by the at least one temperature sensor component indicates overheating.

16. A component carrier, comprising:
a stack of electrically conductive layer structures and/or electrically insulating structures, wherein the at least one electrically insulating layer structure comprises at least one of the group consisting of resin, reinforced or non-reinforced resin, epoxy resin or Bismaleimide-Triazine resin, FR-4, FR-5, cyanate ester, polyphenylene derivate, prepreg material, polyimide, polyamide, liquid-crystal polymer, epoxy-based Build-Up Film, polytetrafluoroethylene;
a first transistor component and a second transistor component embedded side-by-side in the stack,
wherein the first transistor component and the second transistor component are embedded at the same vertical level within a central core layer of the stack, wherein the central core layer comprises a thickness that is larger than the thickness of the first transistor and is larger than the thickness of the second transistor; and
at least one control chip, configured for controlling at least one of the first transistor component and the second transistor component,
wherein the at least one control chip is surface mounted on the stack.

17. The component carrier according to claim 16, wherein the central core layer is a single solid layer.

* * * * *